United States Patent
Hosomi et al.

[11] Patent Number: 5,825,081
[45] Date of Patent: Oct. 20, 1998

[54] TAPE CARRIER AND ASSEMBLY STRUCTURE THEREOF

[75] Inventors: Eiichi Hosomi, Kawasaki; Chiaki Takubo, Tokyo; Hiroshi Tazawa, Ichikawa; Koji Shibasaki, Kawasaki, all of Japan

[73] Assignee: Kabushiki Kaisha Toshiba, Kawasaki, Japan

[21] Appl. No.: 729,420

[22] Filed: Oct. 11, 1996

[30] Foreign Application Priority Data

Nov. 6, 1995 [JP] Japan ................................. 7-287210

[51] Int. Cl.⁶ ................................................. H01L 23/495
[52] U.S. Cl. .......................... 257/668; 257/667; 257/669; 361/813; 361/820
[58] Field of Search ................................. 257/667, 668, 257/669; 361/813, 820

[56] References Cited

U.S. PATENT DOCUMENTS

| | | | |
|---|---|---|---|
| 4,280,132 | 7/1981 | Hayakawa et al. | 257/667 |
| 4,400,714 | 8/1983 | Brown | 257/669 |
| 5,220,196 | 6/1993 | Michii et al. | 257/668 |
| 5,250,842 | 10/1993 | Ikeda | 257/669 |
| 5,424,577 | 6/1995 | Suzuki et al. | 257/667 |
| 5,541,447 | 7/1996 | Maejima et al. | 257/669 |
| 5,554,885 | 9/1996 | Yamasaki et al. | 257/668 |
| 5,637,914 | 6/1997 | Tanaka et al. | 257/674 |

*Primary Examiner*—David Ostrowski
*Attorney, Agent, or Firm*—Finnegan, Henderson, Farabow, Garrett & Dunner, L.L.P.

[57] ABSTRACT

The present invention is characterized by providing leads not contributing to actual connection outside the corner leads to prevent the deformation of the corner leads and improve the yield of tape carriers. A device hole is made in a near-central place of an insulating resin film. Around the device hole, outer-lead holes are made. On the insulating resin film, a plurality of wiring patterns are provided and forced to project into the device hole. The plurality of wiring patterns are formed into a plurality of inner leads, of which the outermost ones are determined to be corner leads. On each corner of the device hole, an aligning mark is provided. Dummy leads are provided closer to the aligning marks. The dummy leads are made shorter than the inner leads and corner leads.

18 Claims, 10 Drawing Sheets

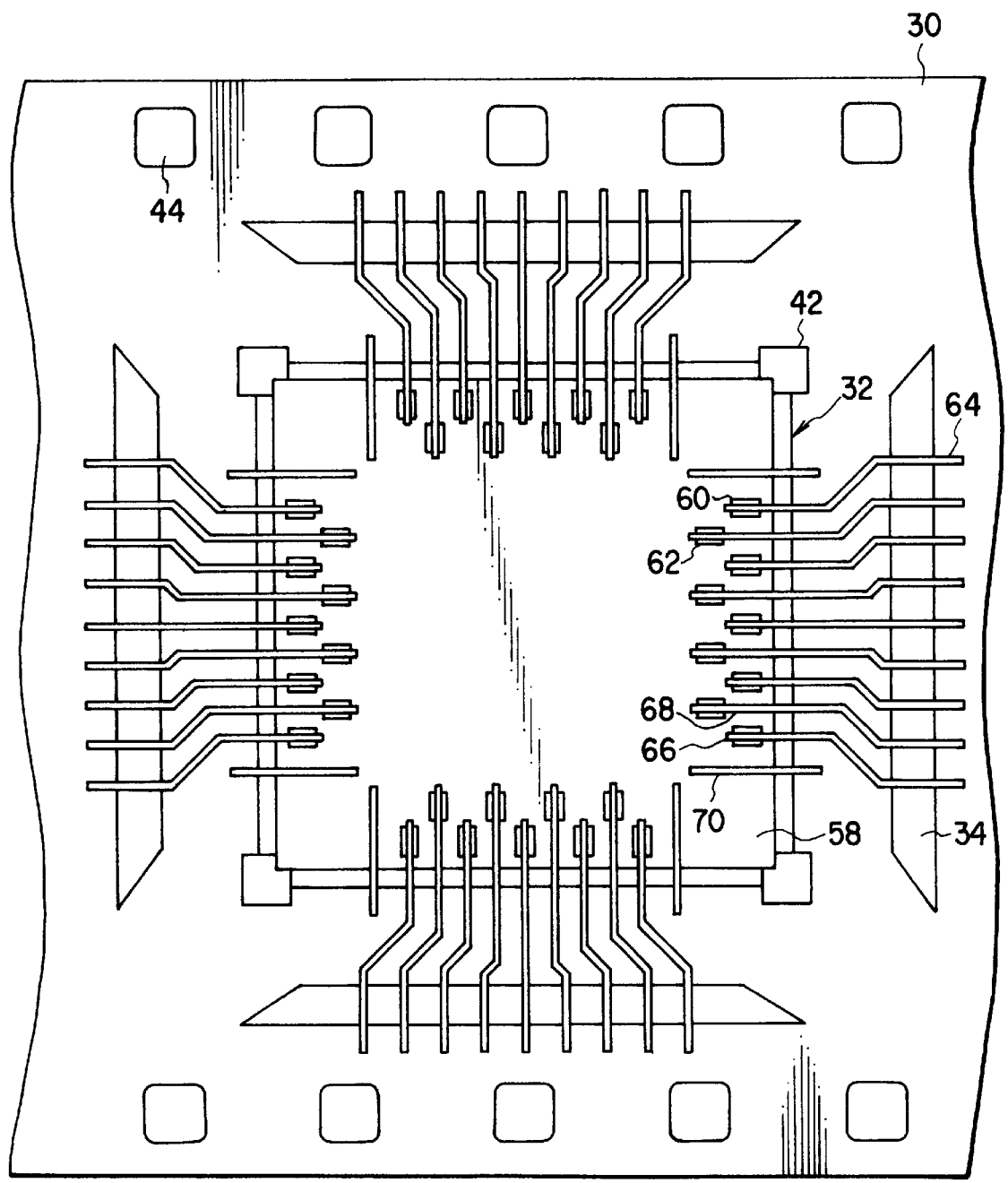
F I G. 11

TAPE CARRIER AND ASSEMBLY STRUCTURE THEREOF

BACKGROUND OF THE INVENTION

1. Field of the Invention

This invention relates to a tape carrier and an assembly structure that connects the tape carrier to a semiconductor device.

2. Description of the Related Art

Since tape carriers are generally easy to make compact, lightweight, and thin and are suitable for semiconductor devices with many pins, they have been widely used in driving ICs or the like for liquid-crystal displays (LCDs).

FIGS. 1A and 1B are a top view and a sectional view of a conventional tape carrier structure, respectively. In FIG. 1A, a square device hole 4 is made in a near-central place of a flexible insulating resin film 2. Around the device hole 4, outer-lead holes 6 are made. On the insulating resin film 2, a plurality of wiring patterns 8 are provided, part of which project into the device hole 4. The wires projecting into the device hole 4 are formed into inner leads 10. The opposite ends of the wire patterns 8 to the tip formed into the inner leads 10 are drawn out, going over the outer-lead holes 6. Some tape carriers have no outer-lead hole.

The wiring patterns 8 and inner leads 10 are usually made of Cu. The surfaces of the wiring pattern 8 and inner leads 10 are subjected to Sn or Au plating. This is done not only to prevent the wiring from corroding but also to bond the inner leads 10 to the bump electrodes on a semiconductor element (not shown) by inner lead bonding (ILB), which will be explained later.

On the four corners of the device hole 4, aligning marks 12 are provided which are needed to align the inner leads 10 with the bump electrodes on the semiconductor element (not shown) exactly in ILB. Numeral 14 indicates transportation holes made in the tape carrier. While in FIG. 1A, aligning marks are shown, there may be a case where such aligning marks are not provided.

As seen from FIG. 1B, the insulating resin film 2 is bonded to the wiring patterns 8 with an adhesive 16 in the tape carrier. The tape carrier having such a structure is called a three-layered tape carrier. Some tape carriers have no adhesive between the insulating resin film 2 and the wiring patterns 8 and are called two-layered tape carriers.

FIGS. 2A and 2B illustrate a state where the tape carrier is bonded to a semiconductor element.

On a semiconductor element 18, a plurality of bump electrodes 20 are provided. The bump electrodes 20 are usually made of Au. After the plurality of bump electrodes 20 have been aligned with the plurality of inner leads 10 formed on the tape carrier on a one-to-one basis, they are bonded to each other by applying specific heat and pressure to them.

The surfaces of the inner leads 10 have undergone Au or Sn plating as described earlier. The inner leads 10 are bonded to the bump electrodes 20 through Au—Au thermocompression bonding in the case of Au plating and through the formation of an Au—Sn eutectic alloy in the case of Sn plating.

A tape carrier having such a structure is suitable for a semiconductor element with many pins and a narrow pitch. It is reported that the maximum number of pins is 820 and the narrowest pitch is 50 $\mu$m.

The pitch of inner leads on a tape carrier is getting narrower every year and a pitch of 60 $\mu$m has been achieved at a mass-production level and a pitch of 50 $\mu$m at a research level. As the pitch of inner leads has got narrower, the width of each inner lead has got smaller accordingly.

The thickness of a conventional inner lead was 35 $\mu$m, whereas an inner lead in a subminiaturized tape carrier is as thin as 25 $\mu$m or 18 $\mu$m. Therefore, as the pitch of inner leads gets narrower, the strength of the leads gets lower.

Because the lead strength becomes lower as described above, the inner leads are much more liable to be deformed. As shown in FIG. 3, the inner leads 10 (hereinafter, referred to as the corner leads 10a) closest to the corners of the device hole 4 are most liable to be deformed. The corner leads 10a tend to bend toward the closest marks 12. The reason for this is as follows.

FIG. 4 shows the flow of the solution in washing and plating the tape carrier after the inner leads 10 have been formed by etching. In the figure, with the inner leads 10 excluding the corner leads 10a, the flow 22 of the solution is equal on both sides of each lead. On both sides of each corner lead 10a, however, the flow of the solution is unequal, on both sides with the result that a pressure difference develops between the right and left sides of each corner lead 10a. The pressure difference bends the corner lead 10a outward, or toward the aligning mark 12. In addition, the pressure difference caused by the air flow during transportation may bend the corner lead, because the strength of the lead is very low.

The insulating resin film 2 has the property of expanding when absorbing moisture. When the film 2 expands, the leads bend outward further, worsening the misalignment error of the leads with the bump electrodes 20 on the semiconductor element 18.

When the corner leads 10a are deformed and bend outward from the device hole 4, it is difficult to align all of the inner leads 10 with the bump electrodes 20 on the semiconductor element 18 and bond the former to the latter by ILB. This lowers the yield of tape carriers with inner leads 10 having a very small pitch, leading to a rise in cost.

To suppress such lead deformation, it can be considered that only the corner leads 10a are made thicker that the other inner leads 10. To make the inner leads 10 thicker this way requires to make the bump electrodes 20 on the semiconductor element 18 thicker so that the former may be bonded to the latter. Furthermore, this needs to give another consideration to the wiring on the insulating resin film 2. Therefore, this approach is not always the best way.

Additionally, the tape carrier differs from a silicon chip bonded to the inner leads in thermal expansion coefficient. Consequently, when thermal stress arising from the operation of the semiconductor element is applied to the inner leads, thermal distortions will concentrate on the corner leads, resulting in the risk of the leads breaking.

SUMMARY OF THE INVENTION

It is, accordingly, an object of the present invention to overcome the aforementioned disadvantages by providing a tape carrier that not only prevents the corner leads from being deformed and damaged but also improves the yield of tape carriers, thereby reducing costs, and an tape carrier assembly structure.

The foregoing object is accomplished by providing a tape carrier comprising: a square opening made in an insulating resin base material; and a plurality of wiring members provided so as to project into the opening from at least two opposite sides of the opening, wherein dummy wiring members projecting into the opening are provided outside the ones of the wiring members closest to the corners of the opening at each side of the opening.

The foregoing object is also accomplished by proving a tape carrier assembly structure comprising: a square opening made in an insulating resin base material; wiring members provided so as to project into the opening from at least two opposite sides of the opening; and bump electrodes provided on a semiconductor element and connected to the wiring members, wherein dummy wiring electrodes projecting into the opening are provided outside the wiring members at each side and are connected mechanically to the bump electrodes.

With the present invention, leads not contributing to actual connection are provided outside the corner leads, that is, close to the corners of the opening. Because the lead not contributing to actual connection be deformed instead of the corner leads being deformed, the amount of deformation of the corner leads can be made smaller remarkably than before.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 11 is a top view of a tape carrier according to a seventh embodiment of the present invention.

DETAILED DESCRIPTION OF THE PREFERRED EMBODIMENTS

Hereinafter, referring to the accompanying drawings, embodiments of the present invention will be explained.

Figure 5:
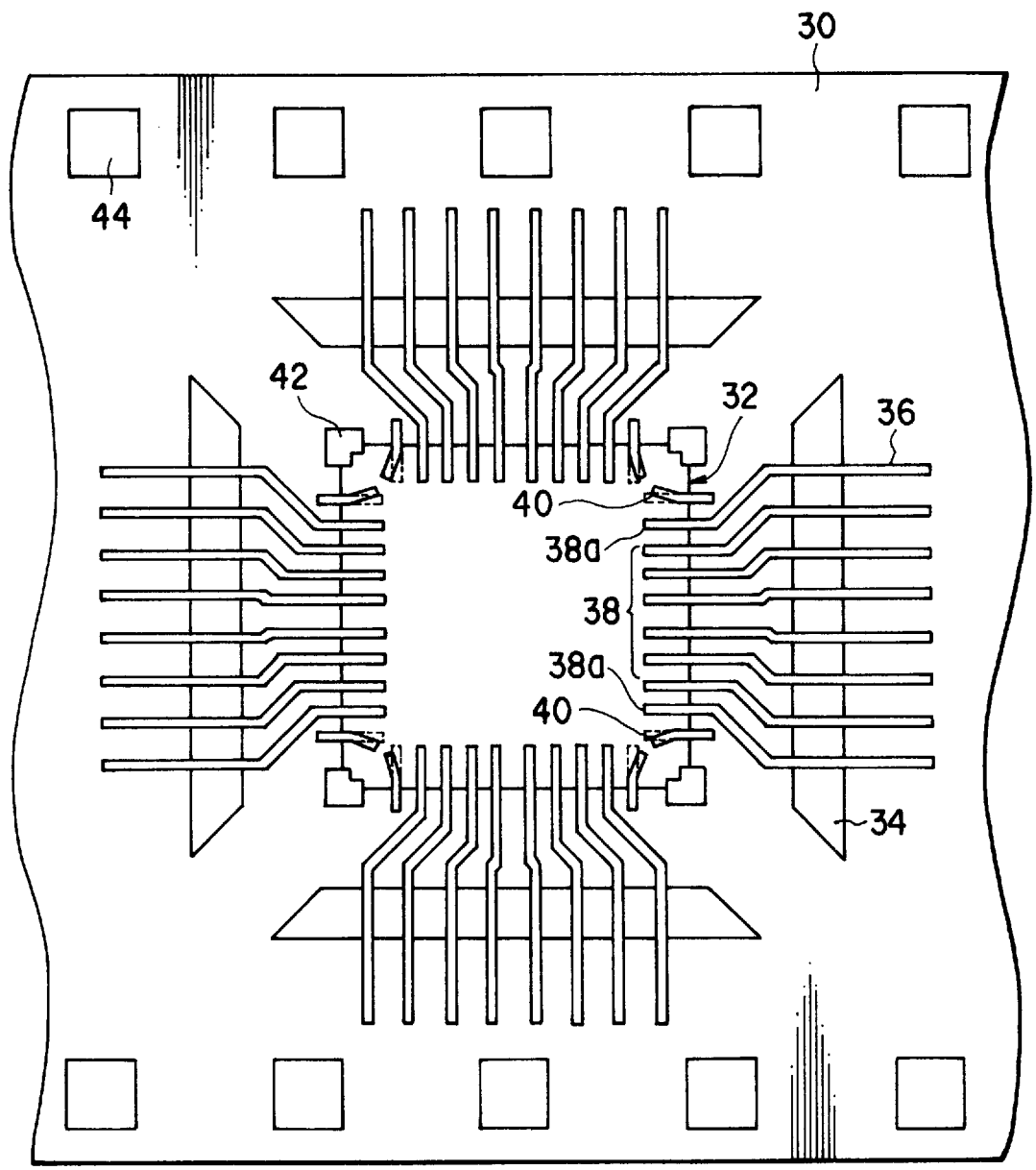
FIG. 5 is a top view of a tape carrier according to a first embodiment of the present invention.

FIG. 5 is a top view of a tape carrier according to a first embodiment of the present invention. In FIG. 5, a square device hole 32 is made in a near-central place of a flexible insulating resin film 30 (e.g., of polyimide resin). Around the device hole 32, four outer-lead holes 34 are made. On the insulating resin film 30, a plurality of wiring patterns 36 are provided in each of four directions as shown in the figure, part of which project into the device hole 32. While in the figure, eight wiring patterns 36 are provided in each of the four directions, the number of wiring patterns is not limited to eight.

Figure 1A:
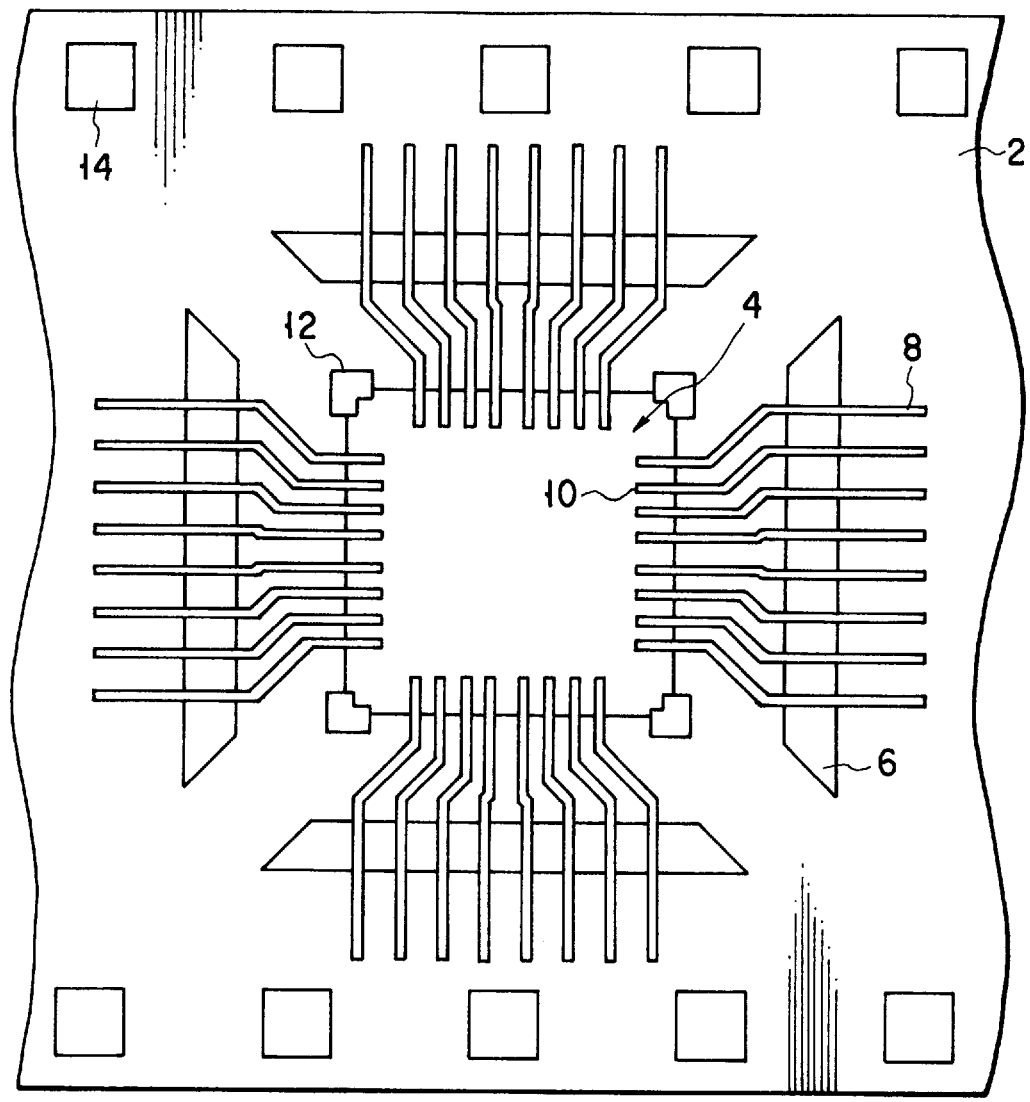
FIGS. 1A and 1B are a top view and a sectional view of a conventional tape carrier structure, respectively.
Figure 1B:
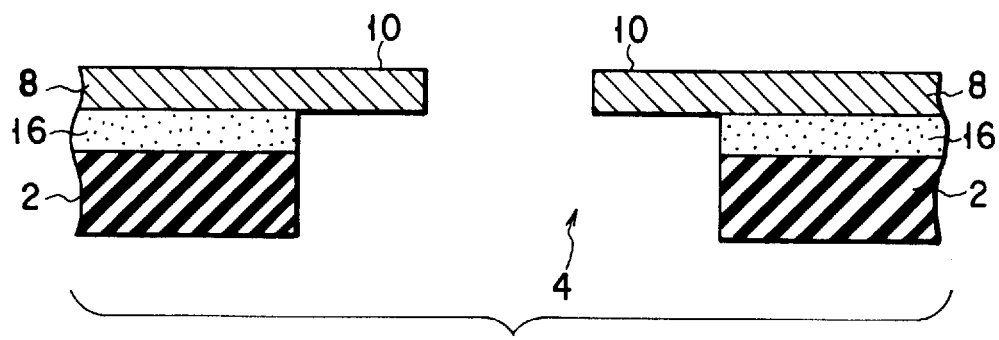
Figure 2A:
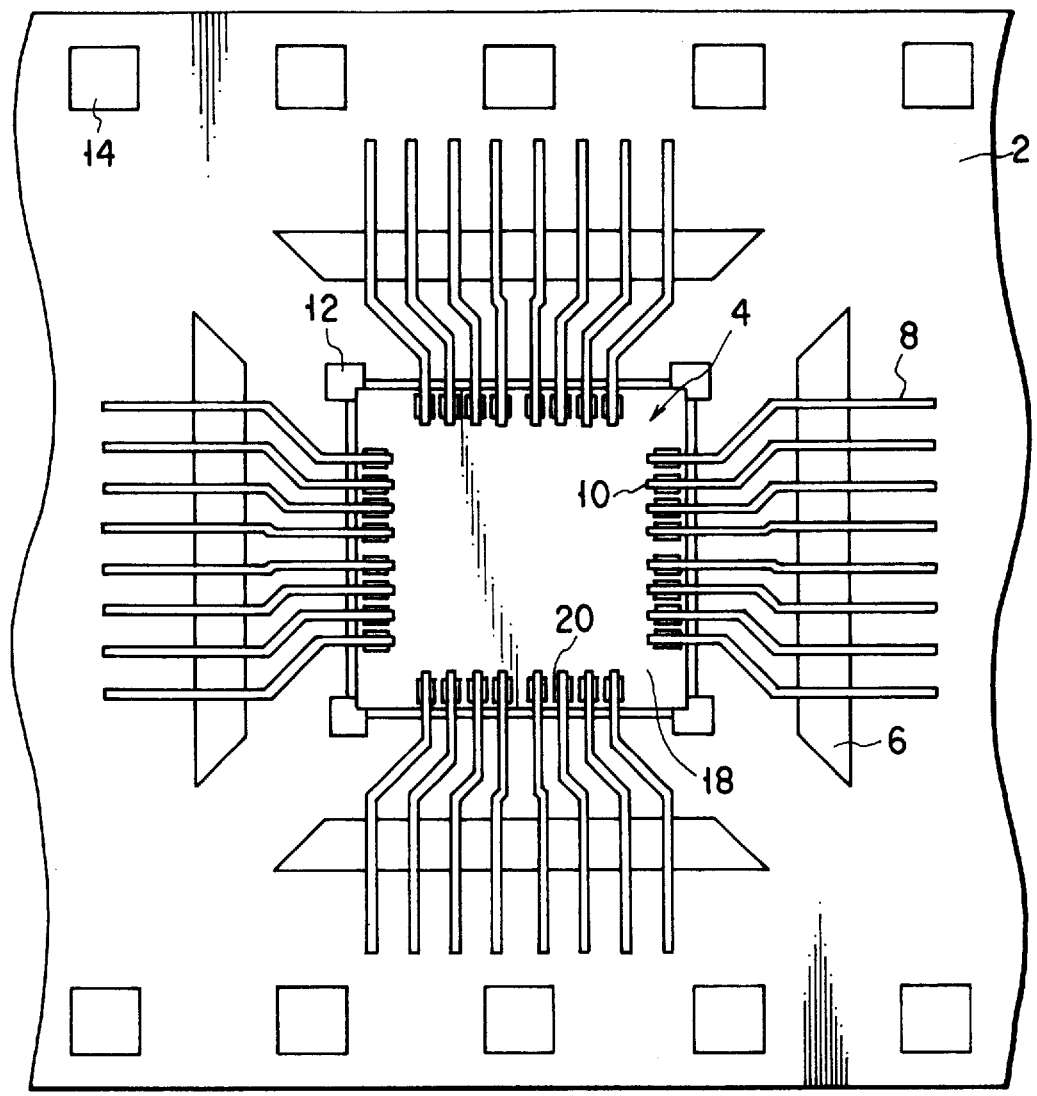
FIGS. 2A and 2B illustrate a state where the tape carrier is bonded to a semiconductor element.
Figure 2B:
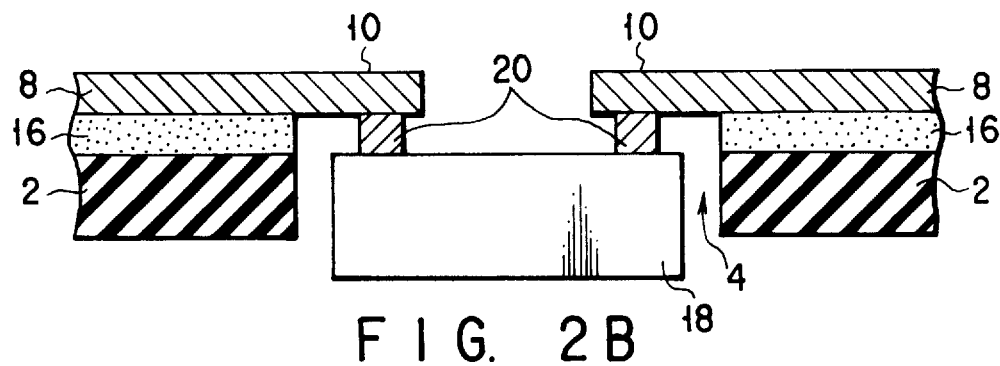
Figure 3:
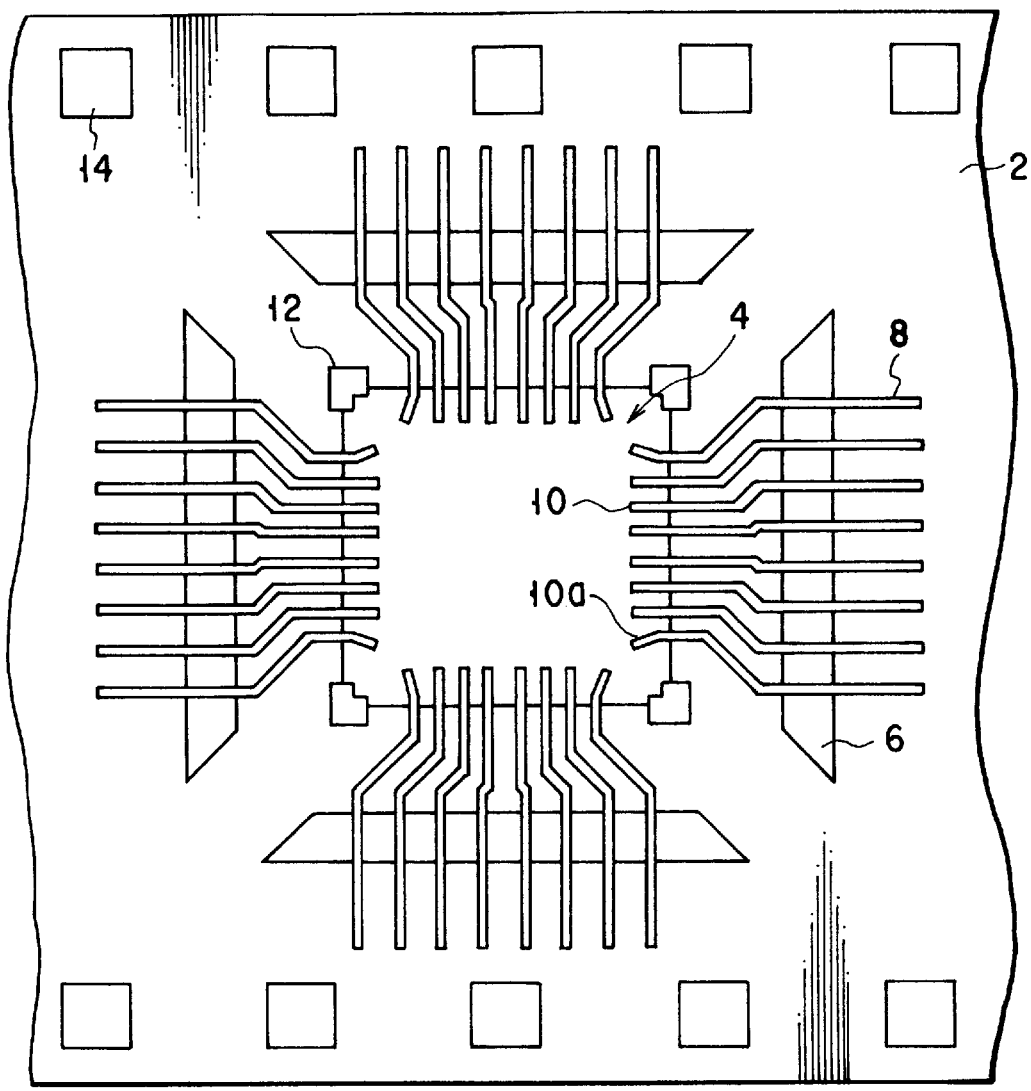
FIG. 3 is a top view of a tape carrier with the corner leads being deformed.

The wires projecting into the device hole 32 are formed into inner leads 38. The outermost inner leads are determined to be corner leads 38a. In FIG. 1, six inner leads and two corner leads 38a are formed in each direction. The opposite ends of the wire patterns 36 to the tip formed into the inner leads 38, 38a are drawn out, going over the outer-lead holes 34.

On each of the corners of the device hole 32, an aligning mark 42 is provided. While in the figure, the aligning marks 42 are provided, some tape carriers have no mark on them. The same is true for the embodiments explained below.

A dummy lead 40 is provided closer to the corresponding aligning mark 42 than the corresponding corner lead 38a. Like the inner leads 38 and corner leads 38a, one end of each dummy lead 40 is formed so as to project into the device hole 32. Before the washing and plating of the tape carrier, the dummy leads 40 are not bent toward the aligning marks 42, but are parallel with the corner leads 38a as shown by the broken lines. The inner leads 38 including the corner leads 38a and the dummy leads 40 before the washing and plating of the tape carrier are parallel at least at the portions projecting into the device hole 32, with the pitch between them being set equal.

The other end of each dummy lead 40 is in a position closer to the device hole 32 than the other wiring patterns 36 on the insulating resin film 30. This helps distinguish the dummy leads 40 from the other inner leads 38 including the corner leads 38a. That is, the dummy leads 40 are made shorter than the inner leads 38 in FIG. 5. They are not necessarily shorter, but may be as long as or longer than the other inner leads. Furthermore, the shape of the dummy leads 40 may be different from that of the inner leads 38.

Figure 4:
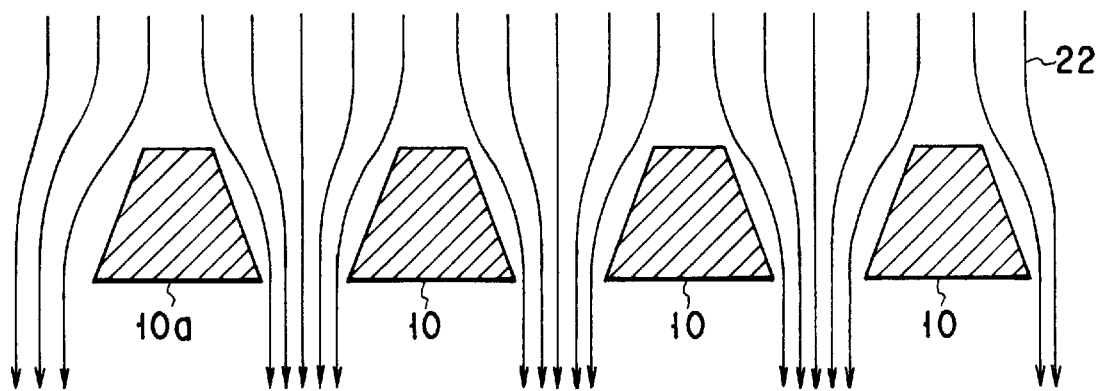
FIG. 4 illustrates the flow of a solution between the inner leads on the tape carrier in washing and plating a conventional tape carrier.

In the device hole 32, the tips of the dummy leads 40 are made longer than or equal to those of the inner leads 38 including the corner leads 38a. The pitch between adjacent leads 38, 38a, 40 is set the same (e.g., less than 80 $\mu$m). The width of each dummy lead 40 is made equal to or greater than that of the other leads 38 (38a) (e.g., 50 $\mu$m or less). The reason why the lead length and the pitch are determined this way is to prevent the corner leads 38a and inner leads 38 from being affected by the flow of the solution in washing and plating the tape carrier (see FIG. 4). The wiring patterns 36 are made thinner than, for example, 35 $\mu$m.

The wiring patterns 36 and the inner leads 38 including the corner leads 38a, and the dummy leads 40 are usually made of Cu. The surfaces of the wiring patterns 36, inner leads 38, corner leads 38a, and dummy leads 40 are subjected to Sn or Au plating. Some tape carriers have no outer-lead hole 34.

Numeral 44 indicates transportation holes made in the tape carrier. Although only one tape carrier 1 is shown in FIG. 5, the insulating resin film 30 is continuous and wound into a roll. The tape carrier can be moved by the transportation holes 44 in both directions in FIG. 5.

With the tape carrier thus constructed, the dummy leads 40 are parallel with the corner leads 38a before patterning as shown by the broken lines. As described earlier, however, they are deformed during the washing and plating of the tape carrier. Specifically, the non-uniform flow of the solution in the washing and plating processes causes a pressure difference between the right and left sides of each dummy lead 40, bending the dummy lead 40 toward the aligning mark 42 shown by a solid line. As for the inner leads 38 and corner leads 38a excluding the dummy leads 40, the flow of the solution is almost equal on both sides of each lead during the washing and plating processes, keeping the amount of deformation at very small levels.

While in the first embodiment, a single dummy lead 40 is provided outside a single corner lead 38a, two dummy leads may be provided for a single corner lead 38a. In this case, too, the same effect is produced as when a single dummy lead is provided for a single corner lead.

The above effect is true for all tape carriers, particularly for the tape carriers whose inner lead pitch is so small that the strength of the leads is low. For example, the effect is particularly prominent when the inner lead pitch is less than 80 μm or the thickness of the inner leads is less than 35 μm.

Figure 6:
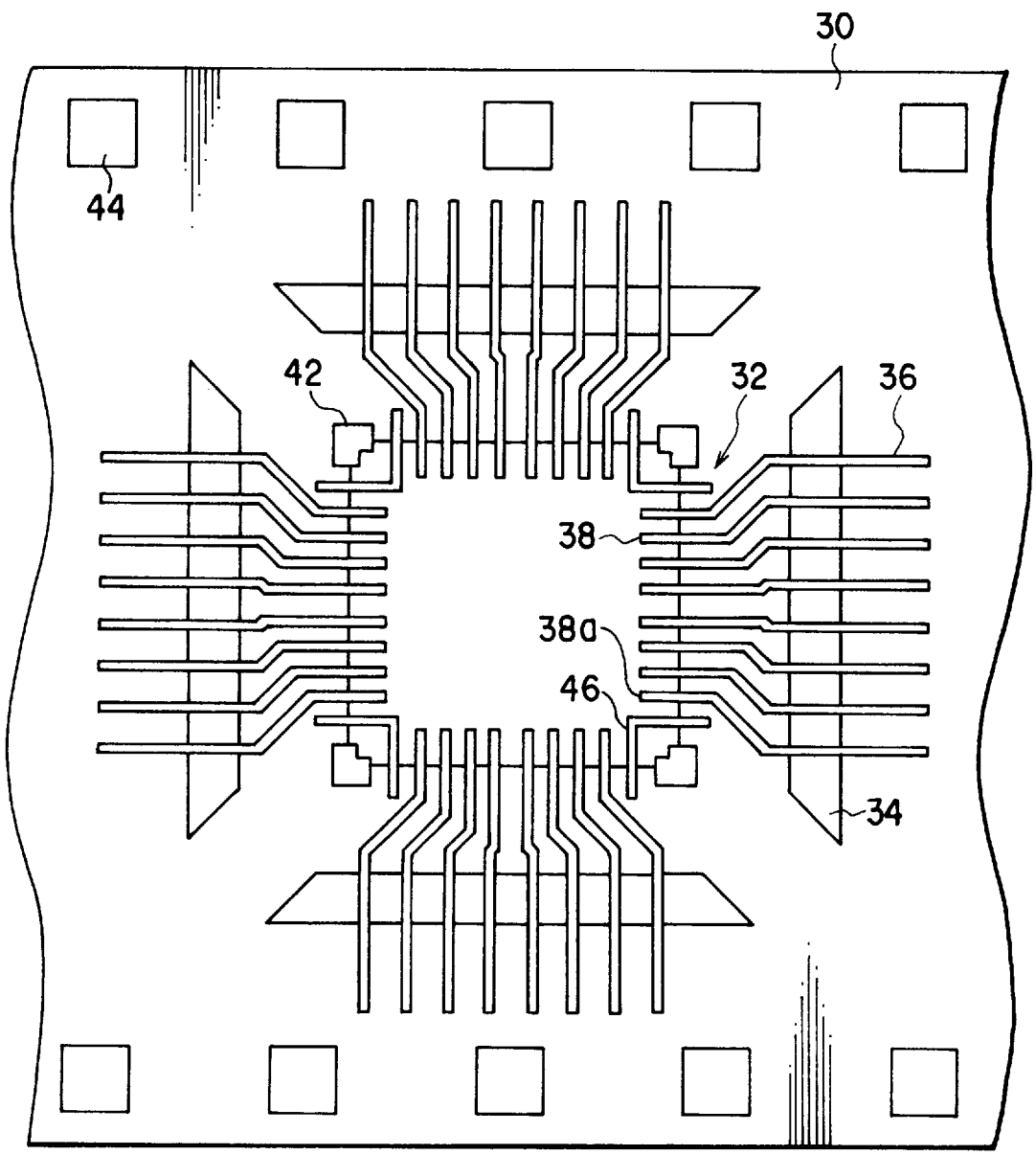
FIG. 6 is a top view of a tape carrier according to a second embodiment of the present invention.

FIG. 6 is a top view of a tape carrier according to a second embodiment of the present invention.

In this embodiment, the tips of adjacent dummy leads sandwiching an aligning mark 42 on each corner of the device hole 32 are connected to each other to form a hook-shaped dummy lead 46. Since the remaining configuration is the same as that in the first embodiment, the same component parts are indicted by the same reference symbols and their explanation will be omitted.

Like the first embodiment, the second embodiment can suppress the deformation of the corner leads 38a toward the aligning marks 42 provided for the device hole 32.

With the second embodiment, because the tips of adjacent dummy leads 46 are connected to each other with an aligning mark 42 intervening between them, this prevents the dummy leads 46 from being deformed in the opposite direction to the aligning mark 42 for some reason, or toward the corner lead 38a and coming into contact with the corner lead 38a. Therefore, this increases the reliability.

Figure 7:
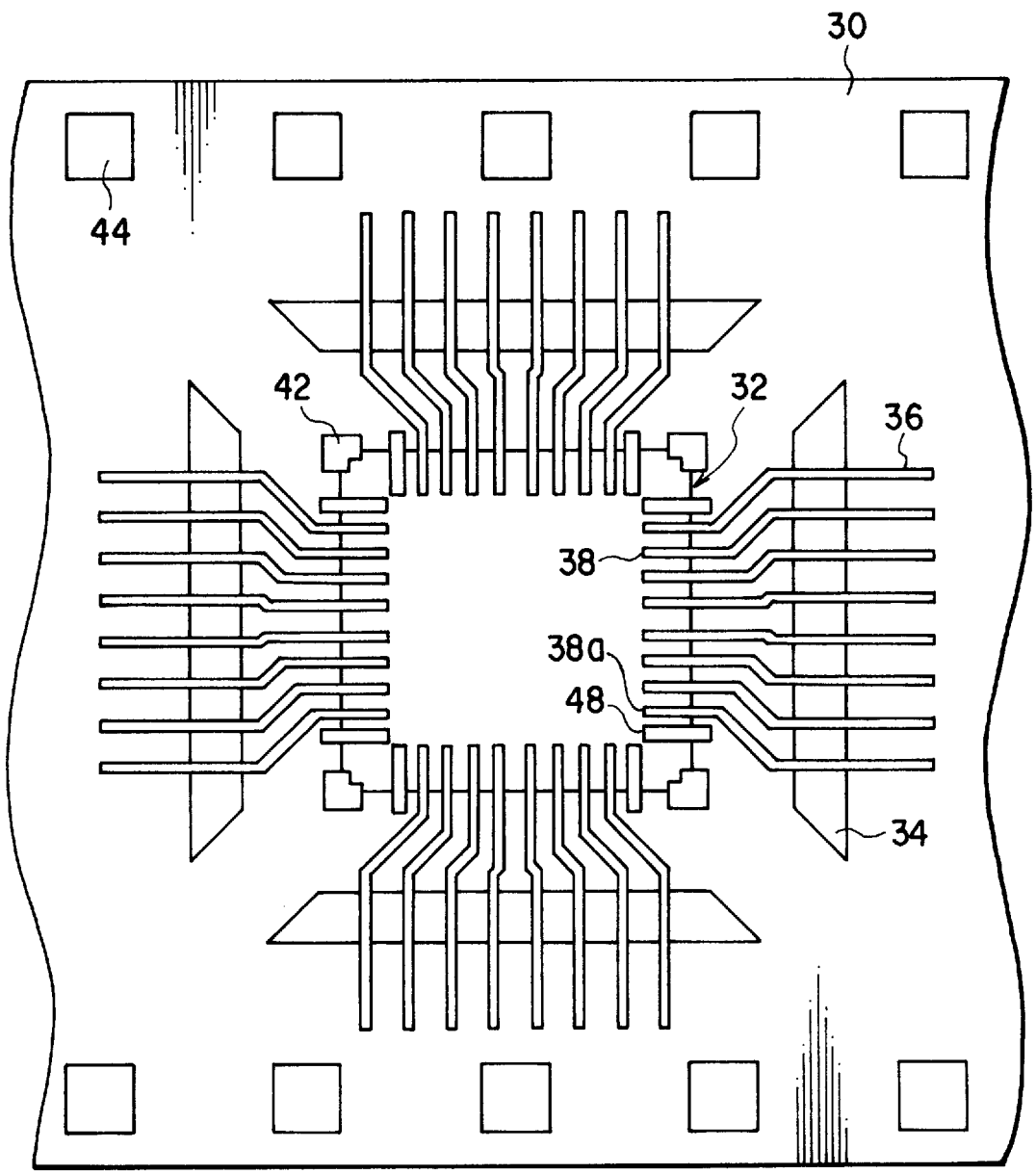
FIG. 7 is a top view of a tape carrier according to a third embodiment of the present invention.

FIG. 7 is a top view of a tape carrier according to a third embodiment of the present invention.

In this embodiment, the dummy leads 48 are made thicker than the inner leads 38 including the corner leads 38a differently from in the first embodiment. What are compared in thickness are the portions of the respective leads at least projecting into the device hole 32. The remaining configuration is the same as that in the first and second embodiments. In FIG. 7, the same component parts as those in the first and second embodiments are indicated by the same reference symbols and their explanation will be omitted.

The third embodiment can suppress the deformation of the dummy leads 48. As a result, the dummy leads 48 are prevented from being deformed in the opposite direction to the closest aligning marks 42 and coming into contact with the adjacent corner leads 38.

When only the dummy leads 48 are made thicker than the other inner leads 38, the wiring on the insulating resin film 30 need not be taken into consideration, so that the design is not more complicated.

Figure 8:
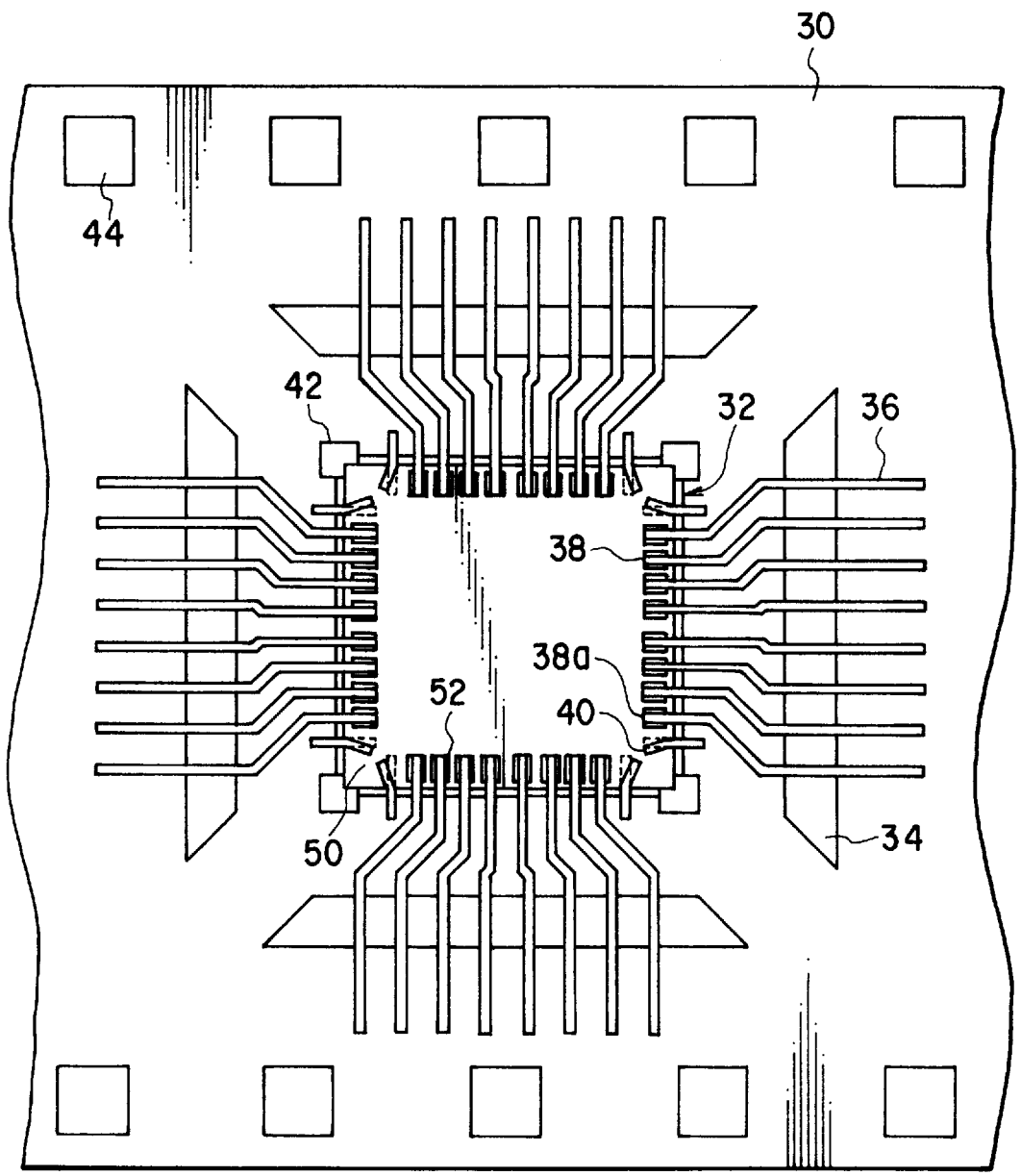
FIG. 8 is a top view of a tape carrier according to a fourth embodiment of the present invention, which shows an assembly structure where the tape carrier used in the first embodiment of FIG. 5 is bonded to a semiconductor element by ILB.

FIG. 8 is a top view of a tape carrier according to a fourth embodiment of the present invention, which shows an assembly structure where the tape carrier used in the first embodiment of FIG. 5 is bonded to a semiconductor element by ILB, that is, a tape carrier package (TCP).

On a semiconductor element 50, a plurality of bump electrodes 52 are provided in each of, for example, four direction. These bump electrodes 52 are arranged in a row along the outer periphery of the semiconductor element 50. All of the inner leads 38 corresponding to the bump electrodes project into the device hole 32 by the same length. The bump electrodes 52 are usually made of Au. The surfaces of the wiring patterns 36, the inner leads 38 including the corner leads 38a, and the dummy leads 40 are subjected to Au or Sn plating.

Then, the inner leads 38 and corner leads 38a are aligned with the bump electrodes 52 on the semiconductor element 50. By applying heat and pressure to them, the inner leads 38 and corner leads 38a are bonded to the bump electrodes 52. The inner leads 38 and corner lead 38a are bonded to the bump electrodes 52 through Au—Au thermocompression bonding in the case of the surfaces of the inner leads and corner leads 38a being plated with Au and through the formation of an Au—Sn eutectic alloy in the case of the surfaces being plated with Sn.

The remaining configuration is the same as that in the first to third embodiments. In FIG. 8, the same component parts as those in the first to third embodiments are indicated by the same reference symbols and their explanation will be omitted.

With the assembly structure of FIG. 8, the dummy leads 40 are deformed and their tips turn toward the closest corners of the device hole 32, that is, the aligning marks 42. The inner leads 38 including the corner leads 38a are hardly deformed, the tape carrier can be aligned exactly with and bonded to the semiconductor element 50 by ILB.

As seen from FIG. 8, there are no bump electrodes in the places on the semiconductor element 50 which correspond to the dummy leads 40. Therefore, the design of a conventional semiconductor element need not be changed and can be used without any modification.

Figure 9:
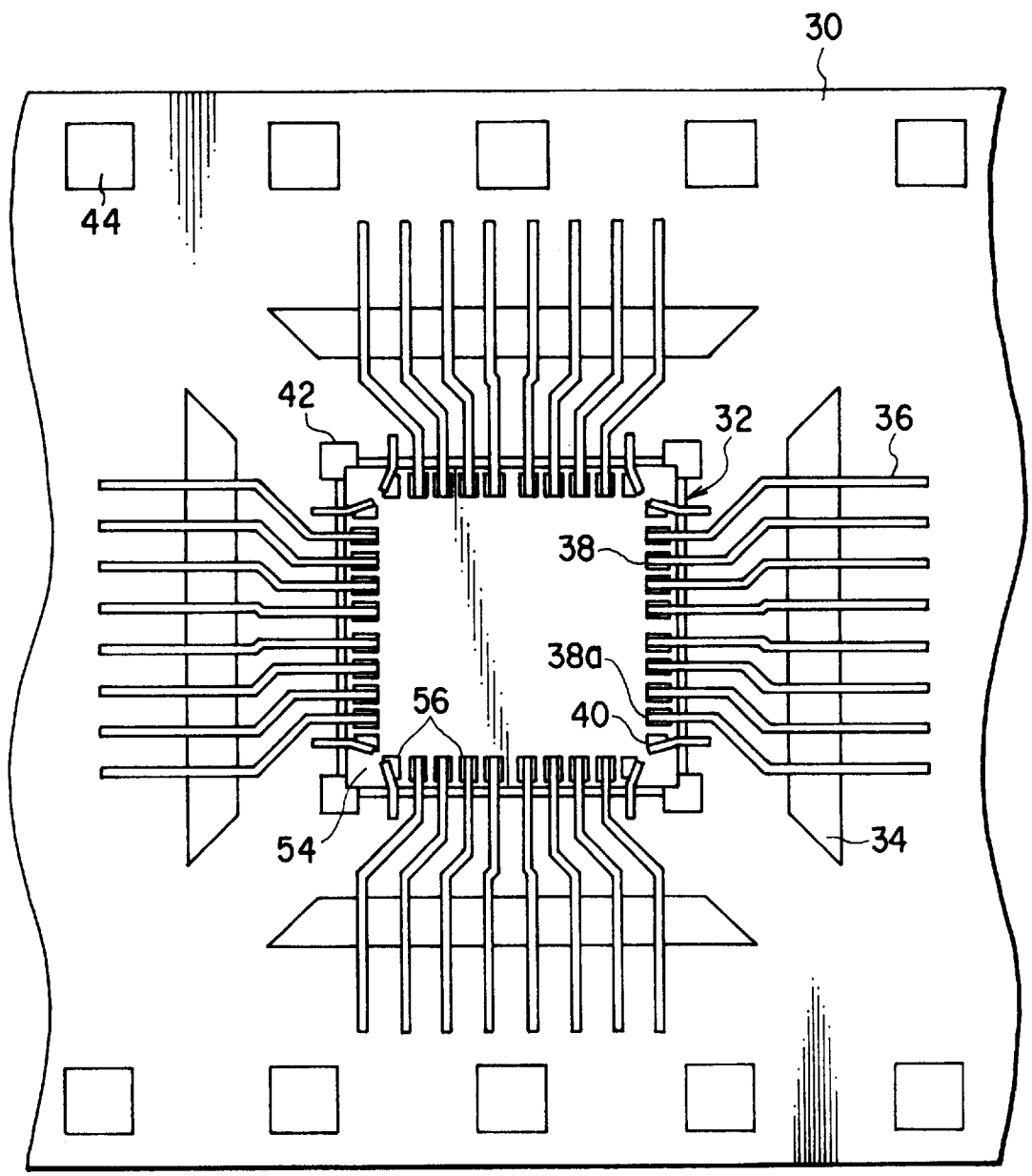
FIG. 9 is a top view of a tape carrier according to a fifth embodiment of the present invention, which shows an assembly structure where the tape carrier used in the first embodiment of FIG. 5 is bonded to a semiconductor element by ILB.

FIG. 9 is a top view of a tape carrier according to a fifth embodiment of the present invention, which shows an assembly structure where the tape carrier used in the first embodiment of FIG. 5 is bonded to a semiconductor element by ILB, that is, a tape carrier package (TCP).

On a semiconductor element 54, a plurality of bump electrodes 56 usually made of Au are provided in each of four directions. There are provided as many bump electrodes 56 as there are the inner leads 38 including the corner leads 38a and the dummy leads 40.

The remaining configuration is the same as that in the first to fourth embodiments. In FIG. 9, the same component parts as those in the first to fourth embodiments are indicated by the same reference symbols and their explanation will be omitted.

Figure 10:
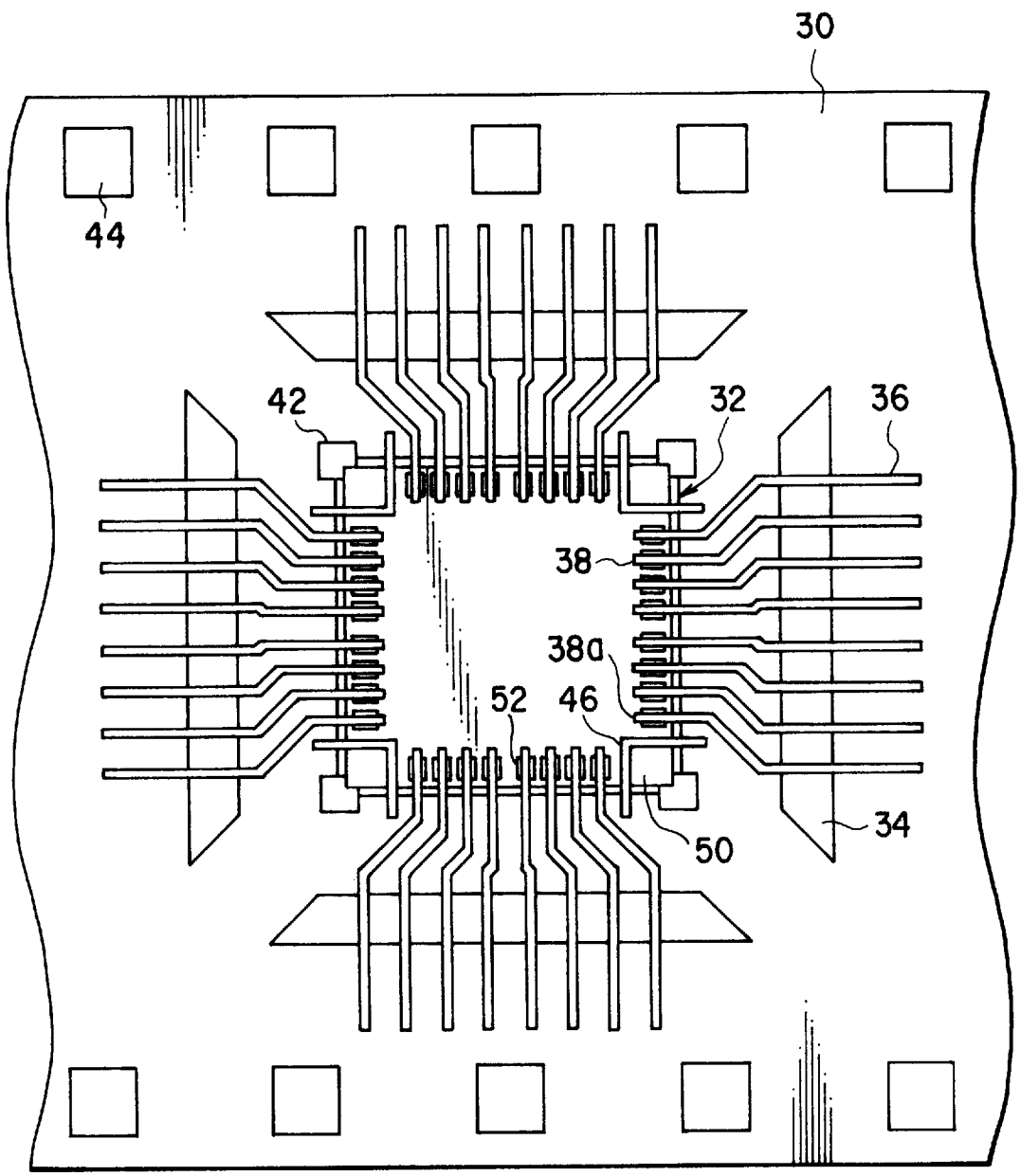
FIG. 10 is a top view of a tape carrier according to a sixth embodiment of the present invention, which shows a TCP using a tape carrier used in the second embodiment of FIG. 6.

FIG. 10 is a top view of a tape carrier according to a sixth embodiment of the present invention, which shows a TCP using a tape carrier used in the second embodiment of FIG. 6.

In FIG. 10, a plurality of bump electrodes 52 are provided in each of four directions on the semiconductor element 50. Then, the inner leads 38 and corner leads 38a are aligned with the bump electrodes 52. By applying heat and pressure to them, the inner leads 38 and corner leads 38a are bonded to the bump electrodes 52.

The remaining configuration is the same as that in the first to fifth embodiments. In FIG. 10, the same component parts as those in the first to fifth embodiments are indicated by the same reference symbols and their explanation will be omitted.

With the sixth embodiment, too, there are no bump electrodes 52 in the places on the semiconductor element 50 corresponding to the dummy leads 40. Therefore, the design of a conventional semiconductor element need not be changed and can be used without any modification.

In the first to sixth embodiments, the bump electrodes 26 (or 56) are arranged in a row along the outer periphery of the semiconductor element 50 (54). All of the inner leads 38 corresponding to the bump electrodes project into the device hole 32 by the same length. The bump electrodes, however, are not necessarily arranged in a row. For example, some bump electrodes may be arranged closer to or farther from the outer periphery. In addition, the inner leads 38 corresponding to the bump electrodes are not necessarily equal in length. For example, long leads may alternate with short leads.

FIG. 11 is a top view of a tape carrier according to a seventh embodiment of the present invention.

On a semiconductor element 58, a plurality of bump electrodes 52 are provided, for example, in each of four directions. These bump electrodes are arranged in two rows (in staggered fashion) along the outer periphery of the semiconductor element 58. Specifically, bump electrodes 60 are arranged closer to the outer periphery of the semiconductor element 58 and bump electrodes 62 are provided inside the bump electrodes 60. (In FIG. 11, five bump electrodes 60 and four bump electrodes 62 are arranged in each of four directions.)

The length of the inner lead of each wiring pattern 64 in the device hole 32 is varied according to the bump electrode 60 or 62. Specifically, a short inner lead 66 in the device hole 32 is formed so as to correspond to an outside bump electrode 60 and a longer inner lead 68 in the device hole 32 is formed so as to correspond to an inside bump electrode 62. The opposite ends of the wiring patterns 64 to the tips formed into the inner leads 38, 38a are drawn out, going over the outer-lead holes 34.

Outside the inner leads 66, that is, to the aligning marks 42, dummy leads 70 are formed. Like the inner leads 66, 68, one end of each dummy lead 70 is formed so as to project into the device hole 32. The other end of each dummy lead 70 is located closer to the device hole 32 than the other wiring patterns 64 on the insulating resin film 30.

The dummy leads 70 in the device hole 32 are made as long as or longer than the inner leads 68 corresponding to the inside bump electrodes 62. At least the inner leads 66, 68 and dummy leads 70 at least projecting into the device hole 32 are set parallel to each other with an equal pitch before the washing and plating of the tape carrier.

The bump electrodes 60, 62 are usually made of Au. The surfaces of the wiring patterns 64, inner leads 66, 68, and dummy leads 70 are subjected to Au or Sn plating.

Then, the inner leads 66, 68 are aligned with the bump electrodes 60, 62 on the semiconductor element 58. By applying heat and pressure to them, the inner leads 66 are bonded to the bump electrodes 60 and the inner leads 68 are bonded to the bump electrodes 62. The inner leads 66, 68 are bonded to the bump electrodes 60, 62 through Au—Au thermocompression bonding in the case of the surfaces of the inner leads 66, 68 being plated with Au and through the formation of an Au—Sn eutectic alloy in the case of the surfaces of the inner leads 66, 68 being plated with Sn.

The remaining configuration is the same as that in the first to sixth embodiments. In FIG. 11, the same component parts as those in the first to sixth embodiments are indicated by the same reference symbols and their explanation will be omitted.

With the assembly structure of FIG. 11, inner leads can be formed so as to correspond to the bump electrodes formed in staggered fashion on the semi-conductor element. This makes it possible to form leads with a more narrower pitch.

The shape of dummy leads corresponding to the inner leads arranged in staggered fashion is not limited to that shown in FIG. 11. For example, the dummy leads may be connected as shown in FIG. 6 or be thicker than the inner leads as shown in FIG. 7.

While in the first to seventh embodiments, the wiring patterns are provided so as to project into square device hole from each side of this hole, or in four different directions, they are not limited to this arrangement, but may take any suitable arrangement as long as they are provided so as to project into the device hole at least in two opposite directions.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A tape carrier comprising:
   an insulating resin base material having a square opening;
   a plurality of wiring members projecting into said opening from at least two opposite sides of said opening: and
   a plurality of dummy wiring members projecting into said opening, the dummy wiring members located on the sides of the opening from which the wiring members project and located next to each respective wiring member located closest to the corners of said opening; and
   wherein each dummy wiring member has a length less than a length of each wiring member and projects into the opening at least as far as the wiring members project into the opening.

2. A tape carrier according to claim 1, wherein portions of said wiring members and said dummy wiring members that project into said opening are separated by an amount equal to the separation between adjacent wiring members for portions projecting into said opening.

3. A tape carrier according to claim 2, wherein the portions of said wiring members projecting into said opening at each side and said dummy wiring members at each side are parallel to each other.

4. A tape carrier according to claim 1, wherein end portions of said dummy wiring members projecting into said opening and located at adjacent sides of said opening and closest to the corners of said opening are connected to each other.

5. A tape carrier according to claim 1, wherein said wiring members at each side include wiring members having a first length and wiring members having a second length shorter than said first length so that the wiring members having the first length may alternate with the wiring member having the second length in said opening; and
   the length of the portions of said dummy wiring members projecting into said opening is longer than the first length of said wiring members.

6. A tape carrier according to claim 1, wherein said dummy wiring members at each side are formed so as to have a greater width than that of said wiring members at the same side.

7. A tape carrier according to claim 1, wherein said opening has aligning marks formed on its corners.

8. A tape carrier according to claim 1, wherein the pitch of said wiring members and dummy wiring members is set smaller than 80 μm.

9. A tape carrier according to claim 1, wherein said wiring members are formed so as to have a thickness smaller than 35 μm and a width smaller than 50 μm.

10. A tape carrier assembly structure comprising:
an insulating resin base material having a square opening; and
a plurality of wiring members projecting into said opening from at least two opposite sides of said opening;
a plurality of bump electrodes provided on a semiconductor element and connected to said plurality of wiring members;
a plurality of dummy wiring members mechanically connected to the bump electrodes, the dummy wiring members projecting into said opening and located on the sides of the opening from which the wiring members project and located next to each respective wiring member located closest to the corners of said opening; and
wherein each dummy wiring member has a length less than a length of each wiring member and projects into the opening at least as far as the wiring members project into the opening.

11. A tape carrier assembly structure according to claim 10, wherein portions of said wiring members and said dummy wiring members that project into said opening are separated by an amount equal to the separation between adjacent wiring members for portions projecting into said opening.

12. A tape carrier assembly structure according to claim 11, wherein the portions of said wiring members projecting into said opening at each side and said dummy wiring members at each side are parallel to each other.

13. A tape carrier assembly structure according to claim 10, wherein end portions of said dummy wiring members projecting into said opening and located at adjacent sides of said opening and closest to the corners of said opening are connected to each other.

14. A tape carrier assembly structure according to claim 10, wherein said wiring members at each side include wiring members having a first length and wiring members having a second length shorter than said first length so that the wiring members having the first length may alternate with the wiring member having the second length in said opening; and the length of the portions of said dummy wiring members projecting into said opening is longer than the first length of said wiring members.

15. A tape carrier assembly structure according to claim 10, wherein said dummy wiring members at each side are formed so as to have a greater width than that of said wiring members at the same side.

16. A tape carrier assembly structure according to claim 10, wherein said opening has aligning marks formed on its corners.

17. A tape carrier assembly structure according to claim 10, wherein the pitch of said wiring members and dummy wiring members is set smaller than 80 μm.

18. A tape carrier assembly structure according to claim 10, wherein said wiring members are formed so as to have a thickness smaller than 35 μm and a width smaller than 50 μm.

* * * * *

UNITED STATES PATENT AND TRADEMARK OFFICE
CERTIFICATE OF CORRECTION

PATENT NO. : 5,825,081
DATED : October 20, 1998
INVENTOR(S) : Eiichi Hosomi et al.

It is certified that error appears in the above-identified patent and that said Letters Patent is hereby corrected as shown below:

Claim 1, Col. 8, line 34, "opening:" should read --opening;--.

Signed and Sealed this

Seventh Day of December, 1999

Attest:

Q. TODD DICKINSON

*Attesting Officer*   *Acting Commissioner of Patents and Trademarks*